US008665727B1

(12) United States Patent
Trimberger (10) Patent No.: US 8,665,727 B1
(45) Date of Patent: Mar. 4, 2014

(54) PLACEMENT AND ROUTING FOR A MULTIPLEXER-BASED INTERCONNECTION NETWORK

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 874 days.

(21) Appl. No.: 12/819,953

(22) Filed: Jun. 21, 2010

(51) Int. Cl.
*G01R 31/08* (2006.01)
(52) U.S. Cl.
USPC ........... 370/238; 370/388; 370/392; 370/401; 712/16
(58) Field of Classification Search
USPC .................. 370/238, 361–388, 256, 401; 326/37–47, 101; 709/252; 716/121, 716/130; 712/16; 714/792
See application file for complete search history.

(56) References Cited

U.S. PATENT DOCUMENTS

| | | | | |
|---|---|---|---|---|
| 5,594,742 | A * | 1/1997 | Hemmati | 714/792 |
| 5,987,028 | A * | 11/1999 | Yang et al. | 370/380 |
| 6,018,523 | A | 1/2000 | Even | |
| 6,212,179 | B1 * | 4/2001 | Murphy et al. | 370/370 |
| 6,370,140 | B1 | 4/2002 | Nayak | |
| 6,584,075 | B1 * | 6/2003 | Gupta et al. | 370/256 |
| 6,598,215 | B2 * | 7/2003 | Das et al. | 716/130 |
| 6,693,456 | B2 | 2/2004 | Wong | |
| 6,940,308 | B2 | 9/2005 | Wong | |
| 6,982,974 | B1 | 1/2006 | Saleh et al. | |
| 7,028,281 | B1 | 4/2006 | Agrawal et al. | |
| 7,242,216 | B1 | 7/2007 | Schmit et al. | |
| 7,285,487 | B2 | 10/2007 | DeHon et al. | |
| 7,903,658 | B1 * | 3/2011 | Kireeti et al. | 370/392 |
| 8,181,139 | B1 * | 5/2012 | Chen et al. | 716/121 |
| 2002/0113619 | A1 | 8/2002 | Wong | |
| 2003/0043842 | A1 | 3/2003 | Tran | |
| 2004/0150422 | A1 | 8/2004 | Wong | |
| 2005/0201396 | A1 * | 9/2005 | Sindhu et al. | 370/401 |
| 2005/0218928 | A1 | 10/2005 | Pani et al. | |
| 2006/0006906 | A1 | 1/2006 | Pani et al. | |

(Continued)

FOREIGN PATENT DOCUMENTS

| | | |
|---|---|---|
| WO | WO 2008/109756 A1 | 9/2008 |
| WO | WO 2008/147926 A1 | 12/2008 |
| WO | WO 2008/147927 A1 | 12/2008 |
| WO | WO 2008/147928 A1 | 12/2008 |

OTHER PUBLICATIONS

U.S. Appl. No. 13/152,131, filed Jun. 2, 2011, Trimberger.
U.S. Appl. No. 12/819,900, filed Jun. 21, 2010, Trimberger.
U.S. Appl. No. 12/819,903, filed Jun. 21, 2010, Trimberger.
Bertacco, V. et al., *Decision Diagrams and Pass Transistor Logic Synthesis*, Technical Report No. CSL-TR-97-748, Dec. 1997, pp. 1-12, Stanford University, Computer Systems Laboratory, Stanford, California, USA.
Mehrotra, Rakesh et al., "Comparison between nMOS Pass Transistor Logic style vs. CMOS Complementary Cells," *Proc. of the 1997 IEEE Conference on Computer Design (ICCD '97)* Oct. 12, 1997, pp. 1-6, IEEE Computer Society, Los Alamitos, California, USA.
Newman, Peter, *Fast Packet Switching for Integrated Services*, Dec. 1988, Wolfson College, University of Cambridge Computer Laboratory, Cambridge, United Kingdom.

*Primary Examiner* — Michael Thier
*Assistant Examiner* — Vincelas Louis
(74) *Attorney, Agent, or Firm* — LeRoy D. Maunu (57) ABSTRACT

A computer-implemented method is described for determining cost in a non-blocking routing network that provides routing functionality using a single level of a plurality of multiplexers in each row of the routing network. The method includes assigning a respective numerical value, represented by bits, to each row of the routing network. A number of bits that differ between the respective numerical values of each pair of rows of the routing network indicates a number of row traversals necessary to traverse from a first row of the pair to a second row of the pair. A signal routing cost is computed from the number of bits that differ between the respective numerical values of the first row and the second row of the routing network. The calculated signal routing cost is provided to a placement module.

19 Claims, 9 Drawing Sheets

(56) References Cited

U.S. PATENT DOCUMENTS

| | | |
|---|---|---|
| 2007/0268041 A1 | 11/2007 | Pani et al. |
| 2008/0272806 A1 | 11/2008 | Pani et al. |
| 2009/0273368 A1 | 11/2009 | Pani et al. |
| 2010/0150147 A1* | 6/2010 | Khanduri ................ 370/388 |
| 2010/0244895 A1 | 9/2010 | Pani et al. |
| 2010/0250784 A1* | 9/2010 | Henry et al. ............. 709/252 |
| 2011/0066825 A1* | 3/2011 | May ......................... 712/16 |

* cited by examiner

PLACEMENT AND ROUTING FOR A MULTIPLEXER-BASED INTERCONNECTION NETWORK

FIELD OF THE INVENTION

The disclosed embodiments generally relate to interconnection networks, and more particularly, to multiplexer-based interconnection networks, including multi-stage interconnection networks.

BACKGROUND

Programmable logic devices (PLDs) are a type of programmable integrated circuit (IC) that can be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The programmable interconnect structure (also referred to as a routing fabric) typically includes conductors of various lengths interconnected by programmable switches (referred to as programmable routing resources). For example, some types of conductors may span two CLBs (referred to as doubles), while other types of conductors may span six CLBs (referred to as hexes). The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

For many FGPA designs it is desirable that the interconnection network allow for a robust set of routing solutions. For instance, the interconnection network can be strict-sense or rearrangeably non-blocking. The technology behind FPGAs, however, is ever-changing and the interconnection network designs have not kept pace. Moreover, many commonly-used interconnection network types have been studied for their efficacy relative to systems other than FPGAs. In general, these networks tend to be expensive in terms of size and delay for the restricted interconnection problem posed for FPGAs. Thus, many interconnection networks are not necessarily well-suited for use in FPGA designs.

The disclosed embodiments may address one or more of the above issues.

SUMMARY

The disclosed embodiments are directed towards a computer-implemented method of determining signal routing costs in a non-blocking routing network. The non-blocking routing network may provide routing functionality using a single level of a plurality of multiplexers in each row of the routing network. The method can include assigning a respective numerical value, represented by bits, to each row of the routing network. The number of bits that differ between the respective numerical values of each pair of rows of the routing network can indicate a number of row traversals necessary to traverse from a first row of the pair to a second row of the pair. A signal routing may be calculated cost based upon the number of bits that differ between the respective numerical values of the first row and the second row of the routing network. The calculated signal routing cost may be then provided to a placement module.

One or more embodiments relate to the numerical values further representing the number of multiplexers necessary to traverse from the one row to another row.

Consistent with one embodiment, the non-blocking routing network can include a multiplexer-based network that provides routing equivalence to a non-blocking crossbar network. The non-blocking crossbar network may have a plurality of crossbar switches making up an ingress stage, a middle stage and an egress stage. The non-blocking crossbar network may include a plurality of crossbar rows, and each crossbar row may include outbound and inbound internal connections to another crossbar row. The multiplexer-based network can include a plurality of multiplexer-based network rows, each row including at least one external input and at least one external output. Each multiplexer-based network row may correspond to a crossbar row of the crossbar network and include a corresponding set of multiplexers. Each set of multiplexers can include an internal multiplexer for each respective outbound internal connection of the respective crossbar row, and the multiplexer may include inputs for signals routable to the respective outbound internal connection. At least one external multiplexer may provide a signal to an external output of the multiplexer-based network row, and the external multiplexer can include a set of inputs that in combination with the internal multiplexers, routes any external input of the multiplexer-based network row to the external output of the multiplexer-based network row.

Consistent with another embodiment, calculating a signal routing cost may include determining at least one of power, delay, or latency for signal traversing a particular signal path.

According to another embodiment, calculating a signal routing cost may be determinative of a cost function for at least one of simulated annealing, min-cut partitioning, or min-cost partitioning.

Consistent with one embodiment, calculating a signal routing cost can include a cost function for at least one of a maze routing or an assignment-based routing.

The step of calculating a signal routing cost, in another embodiment, can include a cost function for of at least one of placement, physical estimation, routing cost, or power estimation.

According to another embodiment, the method can include identifying a routing path between two rows by incrementally modifying single bits of an assigning numerical value for one of the two rows to arrive at an assigned numerical value for the other of the two rows, wherein each incremental modification of a bit represents a row in the routing path.

Weights can be assigned to signals and the routing cost may be a function of the assigned weights in another embodiment.

Another embodiment relates to a computer-implemented method of placing logic functions in a programmable integrated circuit that includes a multiplexer-based routing network that emulates a crossbar non-blocking routing network. The method can include using a programmed processor to perform operations including calculating routing costs for the multiplexer-based network according to respective numerical values assigned to rows of a set of rows of the multiplexer-based network. A number of bits that differ between the respective numerical values of each pair of rows of the multiplexer-based network corresponds to a minimum number of row traversals necessary to route a signal between a first row and a second row of the pair. The operations can also include selecting a placement of logic blocks as a function of the calculated routing costs, and storing the selected placement in a non-transitory storage medium.

In certain embodiments, the multiplexer-based network provides routing equivalence to the crossbar non-blocking network that has a plurality of crossbar switches making up an ingress stage, a middle stage, and an egress stage. The crossbar non-blocking network can include a plurality of crossbar rows, each crossbar row having outbound and inbound internal connections to another crossbar row. The multiplexer-based network may include a plurality of multiplexer-based network rows, each row including at least one external input and at least one external output. Each of the multiplexer-based network rows may correspond to a crossbar row of the crossbar network and may include a corresponding set of multiplexers. Each set of multiplexers can include an internal multiplexer for each respective outbound internal connection of the respective crossbar row, and the internal multiplexer may include inputs for signals routable to the respective outbound internal connection. At least one external multiplexer may provide a signal to an external output of the multiplexer-based network row. The external multiplexer can include a set of inputs that in combination with the internal multiplexers, routes any external input of the multiplexer-based network row to the external output of the multiplexer-based network row.

According to another embodiment, signal values may be stored at the output of the multiplexers within the multiplexer-based network.

A set of rows directly connected to a particular row can be identified, in another embodiment, by finding a set of numerical values that differ from the numerical value assigned to the particular row by only a single bit.

In another embodiment, the calculated routing costs can include one or more of latency, delay, or power.

According to another embodiment, a non-transitory computer-readable storage medium includes a set of stored instructions that when executed by a computer processor perform a method of determining signal routing costs in a non-blocking routing network. The non-blocking routing network provides routing functionality using a single level of a plurality of multiplexers in each row of the routing network. The method includes assigning a respective numerical value, represented by bits, to each row of the routing network. The number of bits that differ between the respective numerical values of each pair of rows of the routing network can indicate a number of row traversals necessary to traverse from a first row of the pair to a second row of the pair. A signal routing may be calculated cost based upon the number of bits that differ between the respective numerical values of the first row and the second row of the routing network. The calculated signal routing cost may be provided to a placement module.

In another embodiment, the method further comprises calculating signal routing costs for a plurality of signal routing paths associated with a proposed placement of logic blocks within a programmable integrated circuit.

Calculating a signal routing cost, in one embodiment, can include assessing a physical distance between rows based upon an order of bits that differ between each row.

One embodiment calculates a signal routing cost by excluding a subset of the signal routing cost in response to an indication that corresponding signals are not critical.

In another embodiment, for a particular signal path between two rows of the routing network, the calculated signal routing cost may represent a minimum number of rows traversed to route a signal therebetween.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

The various embodiments relate to intelligent placement and routing for an interconnection network within an integrated circuit (IC) package. The routing and placement are selected as a function of various properties of the interconnection network. Accordingly, the present disclosure first discusses various embodiments of such interconnection networks and then discusses placement and routing for the interconnection networks within an integrated circuit (IC) package. FPGAs are used herein as exemplary ICs to which the invention can be applied. However, please note that the invention is not so limited, and can be applied to other programmable ICs.

Consistent with a particular implementation, an interconnection network is implemented using a set of multiplexers that is designed to provide the functional equivalent to a crossbar switch-based network. The use of multiplexers as the primary switching control elements can be useful for reducing the propagation time of signals through the network while also providing improvements in wire lengths.

Many interconnection networks use multistage interconnection networks. Such multistage networks can include three stages of switches: ingress switches, middle switches and egress switches. The ingress switches receive global/external signals as inputs and provide these global signals to the middle switches using internal connections. The middle switches receive and transmit signals on such internal connections. Egress switches receive signals from internal connections from the middle switches and transmit the signals to global outputs. A multi-stage network may be hierarchical in that one stage of switching is itself a multi-stage network.

As used herein and unless otherwise stated, a non-blocking network can be either a strict-sense or rearrangeably non-blocking network. Non-limiting examples of multistage interconnection network types include Clos, Benes, Banyan, Omega and Delta. A Clos network can be either a strict-sense or rearrangeably non-blocking network. A Benes network is a rearrangeably non-blocking network that can include many internal/middle stages. A Benes network may be extended to be non-blocking for multi-cast signals.

Examples discussed herein refer to embodiments that are discussed in relation to one or more particular network types. However, the embodiments are not so limited. For instance, the various embodiments that are premised upon aspects of particular networks, such as Benes networks, can be generalized to allow for various other types of networks to be used. Moreover, relatively minor variations can be made to the particular network types. This can include modifying a few inputs, outputs, switches or connections, whilst the majority of the network remains the same. In this manner, the resulting network might not be 100 percent non-blocking; however, such minor changes are often largely immaterial, e.g., when the network remains very close to being non-blocking despite the modifications.

Particular aspects of the present disclosure discuss embodiments in relation to network rows. The term "network row" generally refers to a set of switches that a signal traverses in order to be routed between an input and an output. Each network row contains a set of switches that are non-overlapping (no switch resides in two different rows) with respect to the switches of each of the other network rows. In a particular example, rows can be defined, within a logical diagram of a network design, by pairing inputs to outputs and then defining the rows according to routing paths that include the minimum number of switches between the paired inputs and outputs. As used herein an internal input or output refers to a connection between rows of a network, and a global/external input or output refers to a connection that leaves the network.

In many FPGA designs the routing fabric allows for bi-directional routing to and from each logic block. Although not necessarily limited thereto, one or more embodiments select the rows by following a path that a signal traverses in order to be routed to and from the same logic block. This can be particularly useful for physical and/or logical design or placement of row components according to the logic block input and output that defines the particular row. For instance, the components of a row can be located near the logic block corresponding to the input and output signals for the logic block, i.e., located physically proximate to a particular logic block relative to the other logic blocks of the FPGA.

Signals originating from components outside the interconnection network are referred to as global input signals. Signals that are provided to components outside of the interconnection network are referred to as global output signals. The ingress stage components and egress stage components of the interconnection network have corresponding global inputs and outputs, respectively. Middle stage components of the interconnection network receive internal inputs and provide internal outputs. The inputs can be connected to components within the same row or to components in another row.

Further embodiments are directed toward implementations of interconnection networks that provide the functionality of a multistage interconnection network using nontraditional multiplexer components. As discussed in more detail herein, the nontraditional multiplexer components can be implemented using wide multiplexers. The nontraditional interconnection network, however, can include multiplexers of varying widths. The widths of these multiplexers can vary according to the number of stages in the multistage interconnection network for which the nontraditional network provides similar or equivalent functionality.

Figure 1:
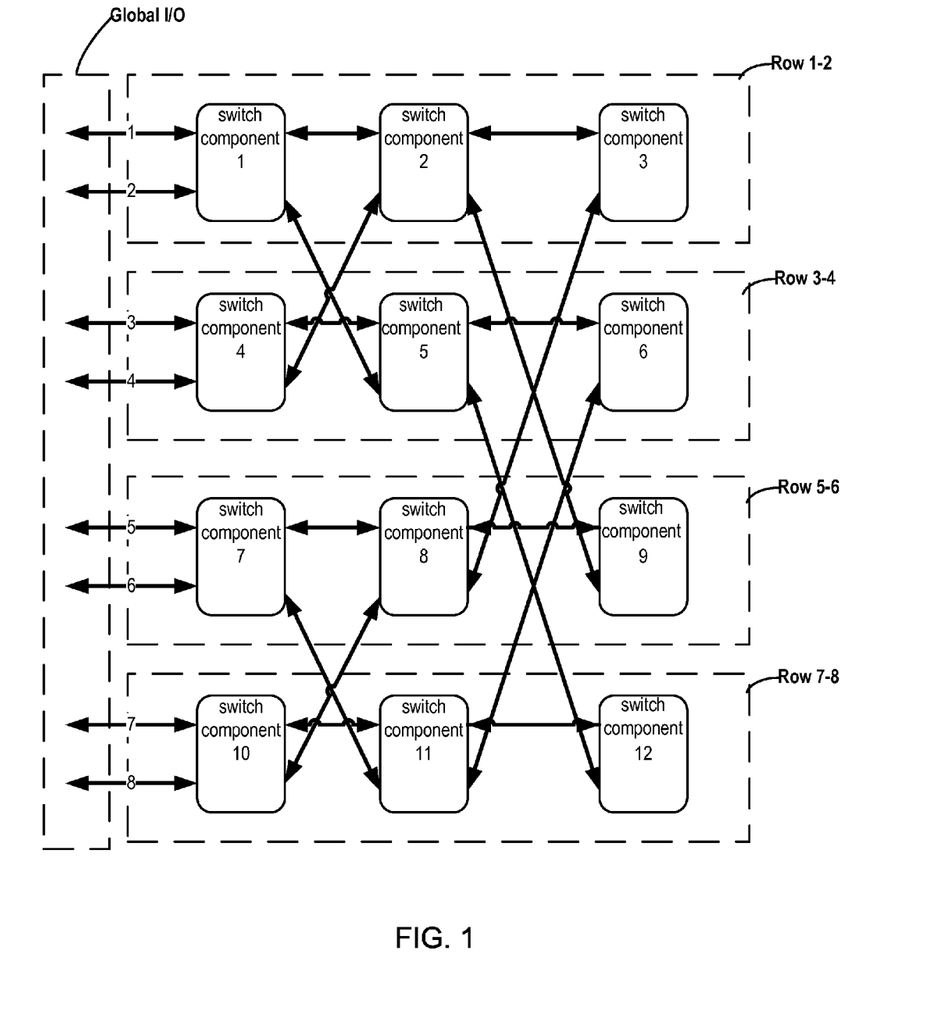
FIG. 1 depicts a logical diagram for an interconnection network, consistent with one embodiment.

Turning now to the figures, FIG. 1 depicts a logical diagram for an interconnection network. The particular interconnection network depicted is consistent with an 8-input, 8-output, 3-stage folded Benes network that is implemented using a plurality of 2×2 crossbar switch elements. Each stage in the network is shown in a column. As explained in more detail hereafter, however, embodiments are implemented using relatively wide multiplexers.

The diagram of FIG. 1 is a folded network in so much as each signal path (arrowed connectors) represents a bidirectional logic path for signals to traverse. The bidirectional path can be implemented as a single wire (or set of wires) with drivers at either end or as two separate wires (or set of wires), one (set) for each direction. Thus, the logic diagram of FIG. 1 could be depicted as a non-folded network with unidirectional arrows by essentially duplicating the various switch components (1-2, 4-5, 7-8 and 10-11), producing a five-stage network. Instead, the diagram of FIG. 1 depicts the network as being folded along the middle stage of switches (3, 6, 9 and 12). The duplicated switch components of the folded network provide the functionality of two switch components, one in each signal direction. Network designs that implement individual switches for each switch can still co-locate the folded switches due to the similarities caused by the symmetry of the network design. Global input signals received in input ports 1-8 are received and routed to global output ports 1-8 according to a desired routing solution. In particular implementations, the interconnection network is rearrangeably non-blocking by virtue of the functionality provided by switch components 1-12 and the connection pattern among them. The diagram of FIG. 1 shows 8 global input/output ports, but is easily scalable to a relatively large number of global ports.

The functionality of the logic diagram of FIG. 1 can be implemented using a number of small switches (e.g., 2×2 crossbar switches). While systems that use relays or optical switches might find such an implementation viable or even preferred, such implementations can be less than ideal for other applications, such as programmable ICs. One potential issue relates to the signal delays caused by traversal of a large number of switch components. For the 8 global ports shown, the number of stages a signal traverses is at least 5. For instance, a signal that is routed from global input port 1 to global output port 6 could traverse the switch components 1→5→12→11→7. As the number of global ports grows, the number of switch components that need to be traversed increases accordingly. Moreover, implementations that use 2×2 crossbar switches as the primary switching components require a significant number of crossbar switches. In some interconnection networks, global outputs may be registered. That is, the output of the switch component may be stored and transmitted to the next stage at a subsequent clock period. Although these registers are not shown in the figures, many of the various embodiments, structures and methods described herein apply to both registered and non-registered networks.

Some embodiments may be particularly useful for providing equivalent functionality to various network types while providing a low number of switching components that must be traversed and/or limiting the total number of switching components in the interconnection network. Particular implementations recognize that use of multiplexer-based logic allows for signal-routing paths to be significantly shortened relative to the number of switch components traversed and/or the wire length of the signals. For instance, a signal routed from a physical location back to an input near the same physical location can be implemented by providing a (relatively wide) multiplexer that effectively bypasses the logical levels between the input and output. Further details on such multiplexer-based configurations are provided herein.

Figure 2:
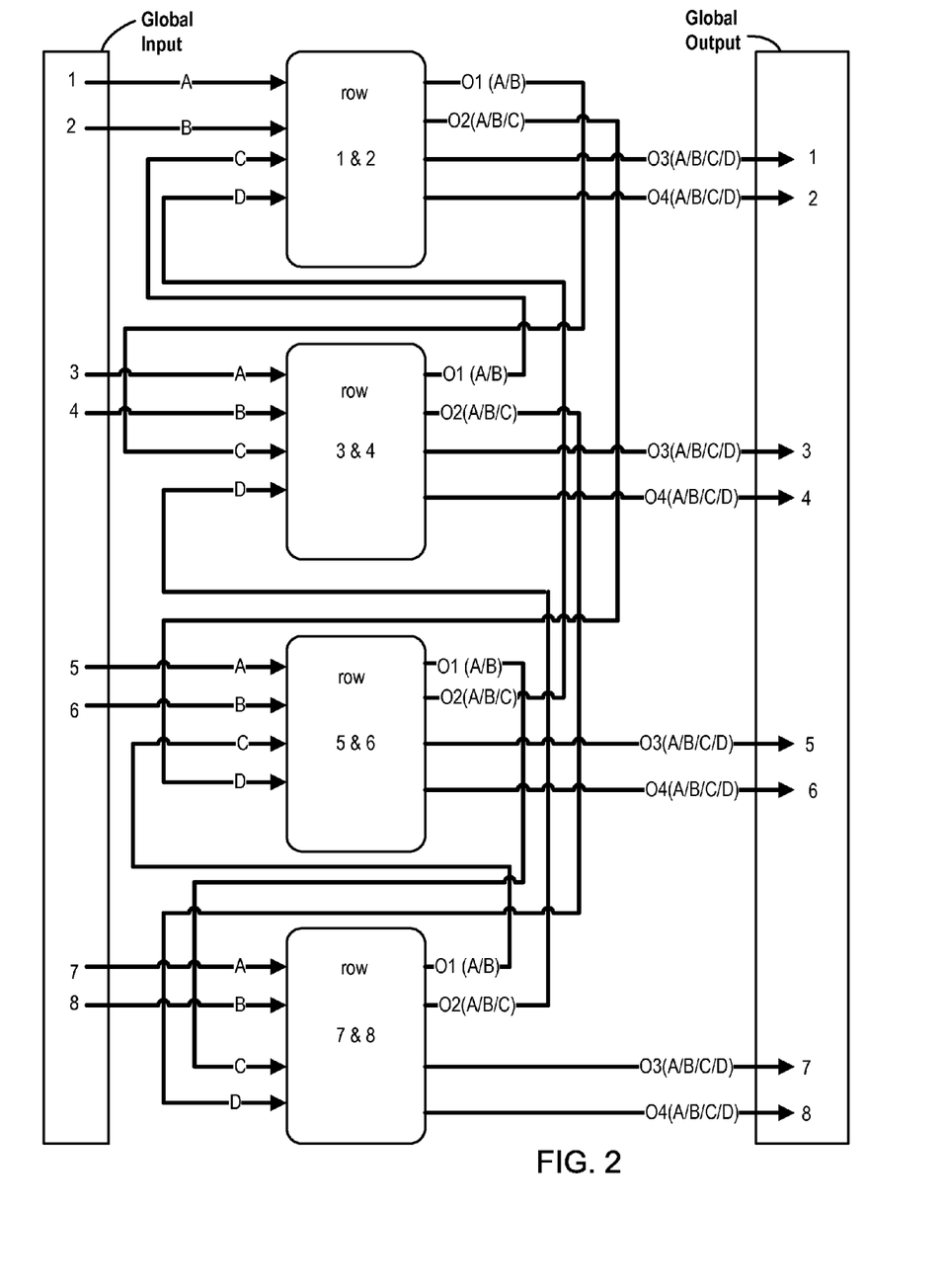
FIG. 2 depicts a logical representation of global and internal signal routing for an interconnection network.

FIG. 2 depicts a logical representation of global and internal signal routing for an interconnection network. The logical representation of FIG. 2 represents the logical routing of signals in a 4×4 Benes network. Each block (1&2 and 3&4) represents an entire row. There are 4 different internal connections between the different rows. Thus, there are 2 internal inputs and 2 internal outputs for each row. FIG. 2 depicts these 4 internal inputs as C and D and the internal outputs as O1 and O2 for each respective row. Each row also contains two global inputs and two global outputs, which correspond to inputs A and B and outputs O3 and O4 of each row, respectively.

The potential mapping of the outputs of each row (O1-O4) relative to the inputs of each row (A-D) is depicted within the parenthetical for each output. Thus, output O1 can be either A or B; output O2 can be either A, B or C and outputs O3 and O4 can be either A, B, C or D. Outputs O1 and O2 are routed to inputs A or B in the other row as depicted. These potential mappings are derived from the corresponding possible routings of a Benes network. In this manner, the depicted network is rearrangeably non-blocking. It should be noted that network types other than a Benes network can be represented in a similar manner and/or minor modifications can be made thereto. For instance, various butterfly networks or mesh networks can be represented according to groupings of logical switch elements and the corresponding possible signal routings on each internal and global connection of the network.

For a particular routing solution, each signal path is set to carry a particular signal of the potential signals listed. In an example use of the interconnection network, global input 3 may be mapped to global output 2. A signal from global input 3 will first be received at row 3&4 at input A. Row 3&4 has the capability of routing a signal on input A to any of outputs O1-O4. One path from global input 3 to global output 2 would include routing the signal from input A to output O2 of row 3&4. Output O2 of row 3&4 is received as input D of row 1&2. From here the signal can be routed directly to output O4 of row 1&2, which is directly connected to global output 2.

While FIG. 2 depicts the logical equivalence to a Benes network, a similar row-based logical diagram can be constructed for a number of other network types. Moreover, the logical diagram can be scaled for virtually any size network and can be implemented for variations of traditional network types. For instance, minor changes to the network types (e.g., the addition or removal of a few nodes or connections) can still be represented by a similar diagram.

Advantages of implementing the switching aspects of the interconnection network using wide multiplexers can be more easily seen when considering larger Benes networks. As the size of a Benes network increases, the stages in the network also increase in number. For some implementations, an increased number of stages can result in increased amount of logic, longer wire lengths and higher delay times.

The significance of the logical diagram of FIG. 2 may not be immediately apparent. Certain embodiments, however, use particular configurations of multiplexers to provide the routing functionality of FIG. 2. In specific embodiments, any signal routing through a particular row traverses only a single switching component (e.g., a single multiplexer). This can be particularly useful for providing reduced latency caused by long wire lengths and/or the traversal of numerous switching components. These aspects are particularly well-suited for many modern programmable IC devices.

Figure 3:
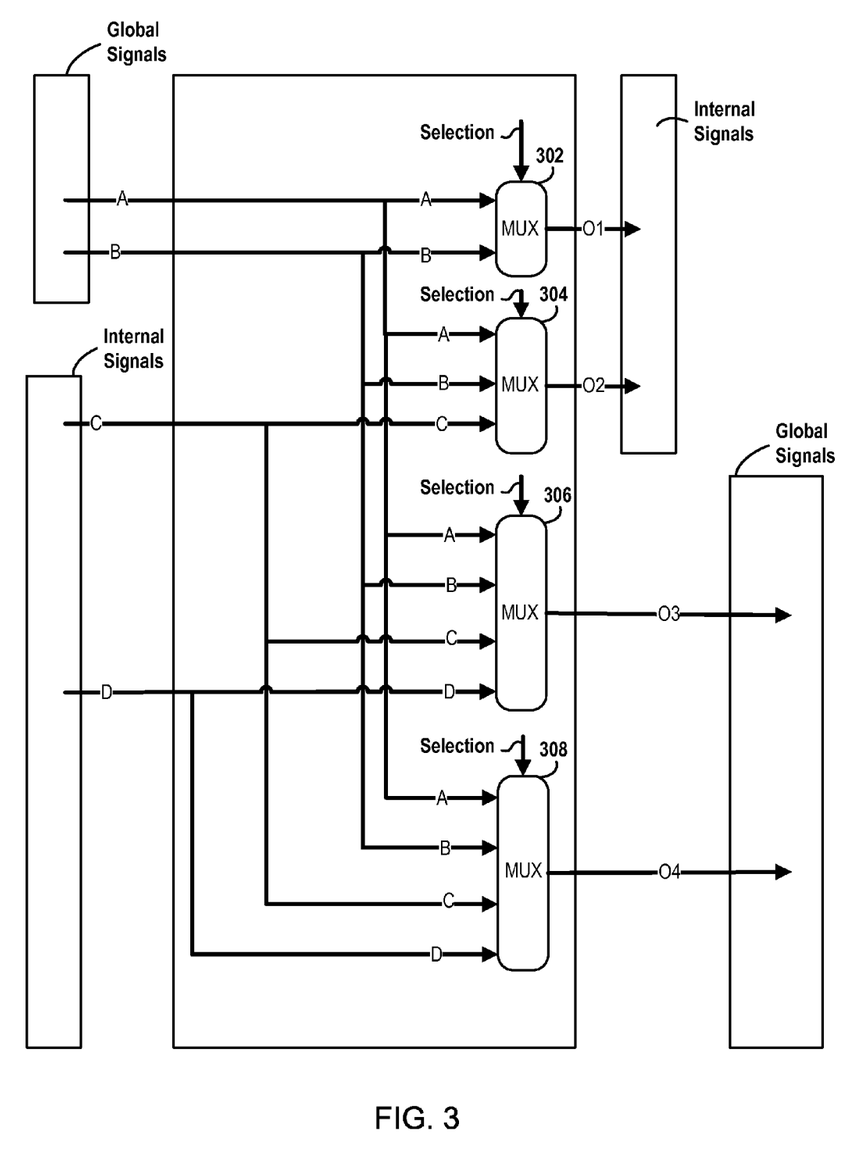
FIG. 3 depicts a set of multiplexers providing the functionality of one row from FIG. 2.

FIG. 3 depicts a set of multiplexers providing the functionality of one row from FIG. 2. Consistent with FIG. 2, each row receives two internal input signals (C & D) and two global input signals (A&B). Each row also provides two internal output signals (O1 & O2) and two global output signals (O3 & O4). Multiplexers 302-308 provide the routing functionality depicted in FIGS. 1 and 2. Selection signals control the outputs of each individual multiplexer.

The particular configuration of multiplexers and signal connections depicted in FIG. 3 represents a logical equivalent of a row taken from a Benes network. Each multiplexer is configured to correspond to an output from the Benes row by receiving, as inputs, each possible signal for the output. Thus, the individual switching components of the traditional Benes network are replaced by a flat set of multiplexers. The flat set of multiplexers is smaller in number than the number of switching elements in a traditional Benes network, and since signals can traverse one of the flat multiplexers instead of several of the Benes switching elements in series, signals reach their destinations with less delay.

The particular configuration is scalable according to the size of the Benes network. To conceptualize how larger networks would be implemented, the multiplexers can be broken into two different groups. The first group of multiplexers provides global outputs and the second group of multiplexers provides internal outputs. As used herein, an internal output is an output that is received by another row as an input, whereas a global output is an output that leaves the interconnection network.

It can be shown that, for a Benes network, any input (whether internal or global) of a particular row can be routed to either of the global outputs of the same row. Accordingly, the global (output) multiplexers of a Benes network-based solution are designed to be able to provide any input as an output. In FIG. 3 this means that each of output O3 and O4 can provide any of inputs A, B, C or D. As the size of the network increases, the number of stages increases. As the number of stages increases, the number of internal inputs for each row also increases. Accordingly, the output multiplexers increase in size to allow any of the inputs to be routed to the global outputs.

The internal (output) multiplexers provide outputs that correspond to various different stages of a Benes network. As such the number of internal multiplexers increases as the number of stages increases. Moreover, the number of possible signals provided at each internal output increases for each successive stage of a Benes network. For instance, internal multiplexer 302 is a 2 to 1 multiplexer that is capable of providing either signal A or B as an output. Internal multiplexer 304 represents an output for a successive stage in a Benes network and is therefore a 3 to 1 multiplexer that is capable of providing any one of signals A, B or C as an output. Thus, as the number of stages increases the size of each additional multiplexer also increases accordingly. This increasing size of multiplexers is not necessarily limited to Benes type networks, and regardless, the particular configuration can be modified to be consistent with network types other than a Benes network.

Figure 4:
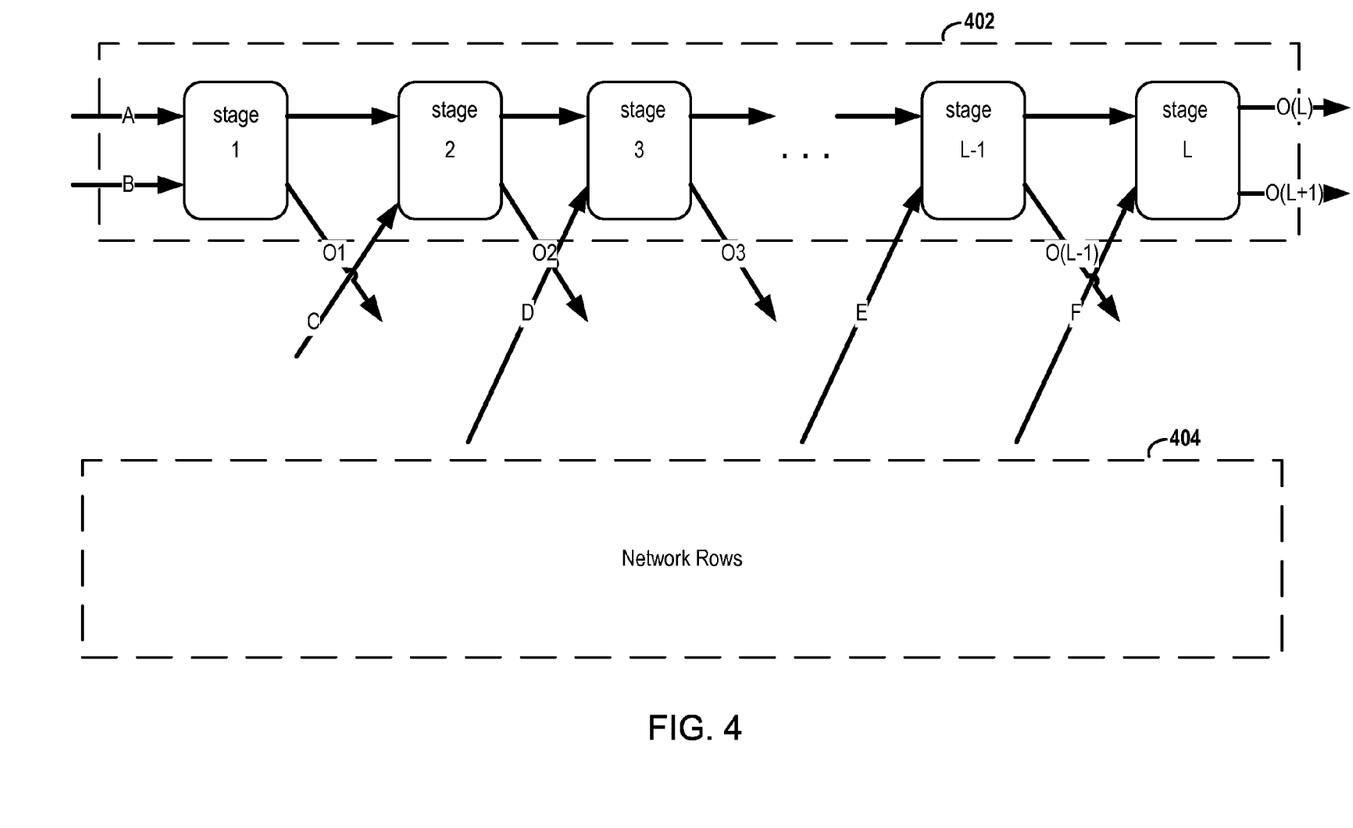
FIG. 4 depicts a logical diagram for a row of a Benes network.

FIG. 4 depicts a logical diagram for a row of a non-folded Benes network. In particular, FIG. 4 shows that the size of the Benes (or other) network is not limited to any particular size. The row 402 contains L stages, with the ellipses between rows 3 and L−2 representing an undetermined number of possible additional stages. Row 402 receives and sends data to other rows 404 in the network. Consistent with the discussion of FIGS. 1-3, each output from the row 402 can be implemented using a multiplexer that receives, as inputs, all possible signals that can be routed thereto. For example, the internal multiplexer for O1 would receive inputs A and B; the internal multiplexer for O2 would receive as inputs A, B and C, and the internal multiplexer for O(L−1) would receive as inputs A, B, C, D and E. The internal multiplexer for O4 would also include any additional inputs for corresponding additional stages between stage 3 and stage L−2. Thus, for a five stage network there are two 6:1 global multiplexers and four internal multiplexers ranging in size from 2:1 up to 5:1. As discussed herein, the various networks can be implemented for a number of different networks including strictly or re-arrangeably non-blocking networks.

Particular implementations are directed toward implementations of networks within a programmable IC. Some programmable ICs include a number of improvements/changes. Some of these improvements include lookup tables (LUTs) with six or more inputs, dedicated multiplexers, multiple-logic outputs, arithmetic support, hard logic for random access memory (RAM), dedicated flip flops, multiple LUTs per tile, swappable LUTs in a tile, I/O distributed in columns throughout the chip, unidirectional interconnection with switches implemented as multiplexers, Fc<<W (the percentage of inputs not connectable each outputs is relatively high) and Fs<3 (each wire in the switch block connects to less than 3 wires). In recognition of these changes, and other changes, various embodiments are particularly well-suited for implementation in a programmable IC. Accordingly, specific embodiments are implemented for programmable IC devices having tiles with 8 or more LUTs, 16 or more inputs, 4 or more outputs and unidirectional wiring.

Figure 5:
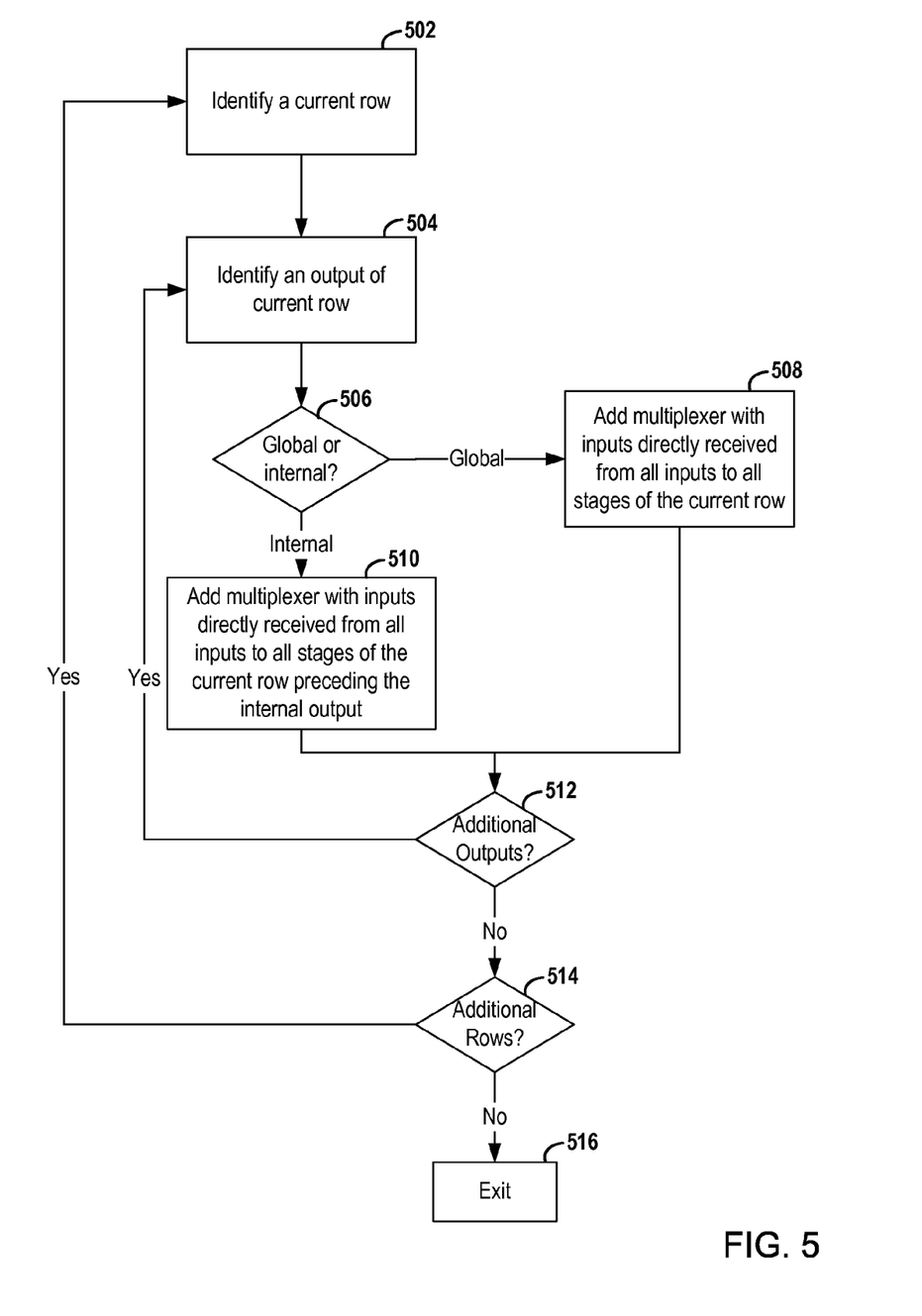
FIG. 5 depicts a flow diagram for designing a new multiplexer-based interconnection network from an existing interconnection network type.

FIG. 5 depicts a flow diagram for designing a new multiplexer-based interconnection network from an existing interconnection network type. The steps or operations depicted in FIG. 5 can be used to modify an existing interconnection network to produce a new interconnection network that uses relatively wide multiplexers to provide low-latency signal paths. The steps can be applied to a variety of different network types including, but not limited to, a Benes network.

Step 502 includes the identification of a current row of the existing interconnection network. A row represents a set of switches that a signal traverses in order to be routed between an input and an output. This means that the signal can be passed from the input to output without leaving the row. Of course, each row can have multiple routing paths that enter and leave the row and a particular signal can be routed out of the row depending upon the particular routing solution and a signal passing from input to output in the same row might still leave the row.

After a current row is selected, an output of that row is selected at step 504. The selected output can be an internal output or a global output. In a particular implementation, the first output selected can represent an output for the first stage of the existing interconnection network. Subsequently selected outputs can be selected based upon outputs from sequentially selected stages.

Step 506 involves a determination as to whether the selected output is an internal output or a global output. If the output is an internal output, the process proceeds to step 510, and if the output is a global output, the process proceeds to step 508.

At step 510, a multiplexer is added to the new network. The multiplexer output provides an internal output that is routed to another row of the new network. The multiplexer is designed to accommodate all possible inputs to the row that can be routed to the selected output. In this manner, the configuration of the multiplexer can be implemented without knowledge of the other rows of the network. The resulting multiplexer is a N:1 multiplexer, where N=the total number of row inputs that can be routed to the selected output.

At step 508, a global multiplexer is added to the new network. The multiplexer output provides a global output that provides a signal to an external connection point of the new network. As in step 510, the multiplexer is designed to accommodate all possible inputs to the row that can be routed to the selected output. For a Benes type network, this includes all inputs to the row. Thus, the multiplexer is an M:1 multiplexer, where M=the total number of row inputs for the row.

At step 512 a determination is made as to whether or not there are any additional row outputs that have not yet been addressed by the method. If there are additional row outputs, the process selects a new row output and repeats. If there are not additional row outputs, the process proceeds to step 514.

At step 514 a determination is made as to whether or not there are any additional rows. If all rows have been addressed by the method, then the process exits at step 516. Otherwise, a new row is selected and the process repeats for the newly selected row.

Reasonable variations can be made to the process depicted in FIG. 5. For instance, various criteria can be used to determine that a wide multiplexer should not be provided for a particular output. In another instance, the width of a multiplexer can be limited to a maximum value. This maximum value can represent the limitations of the technology or be set based upon other criteria. The equivalent function can be implemented by smaller multiplexers arranged in combination.

The steps can be automated using a specially designed processor system. Instructions stored on a non-transitory storage medium can be accessed by a processor to implement the various steps. The processor can then store the output of the process, e.g., data representing the new interconnection network, on a non-transitory storage medium. This stored data can then be accessed and used to produce a circuit corresponding to the new interconnection network.

Figure 6:
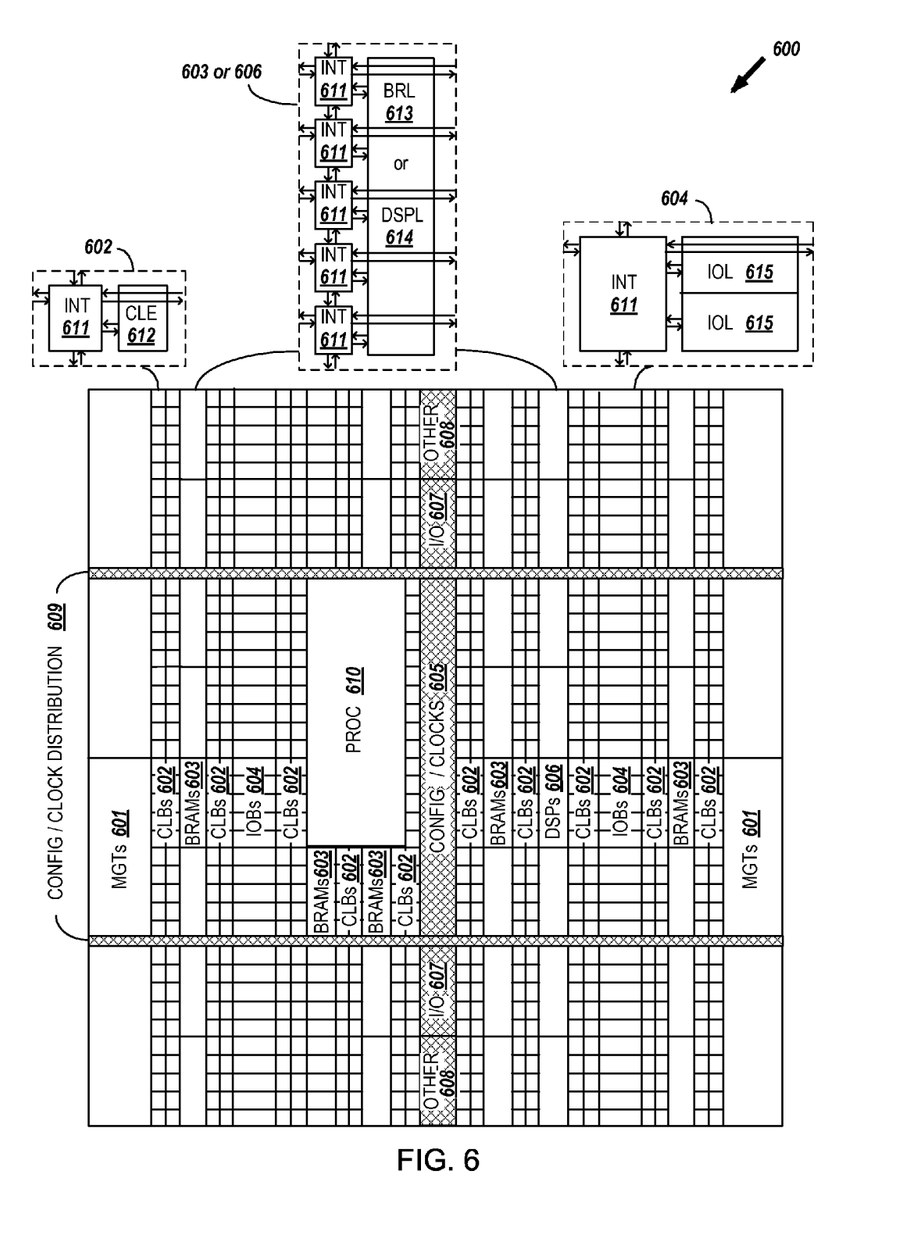
FIG. 6 is a block diagram view of a programmable integrated circuit.

FIG. 6 is a block diagram view of a programmable integrated circuit. The integrated circuit is an FPGA that includes a programmable interconnect element (INT 611) switching fabric for routing signals between tiles. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6. Collectively, the interconnect elements can be configured according to the various embodiments discussed herein.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610). Configuration information and clocks can be distributed using config/clock distribution 609.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Often, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

Figure 7:
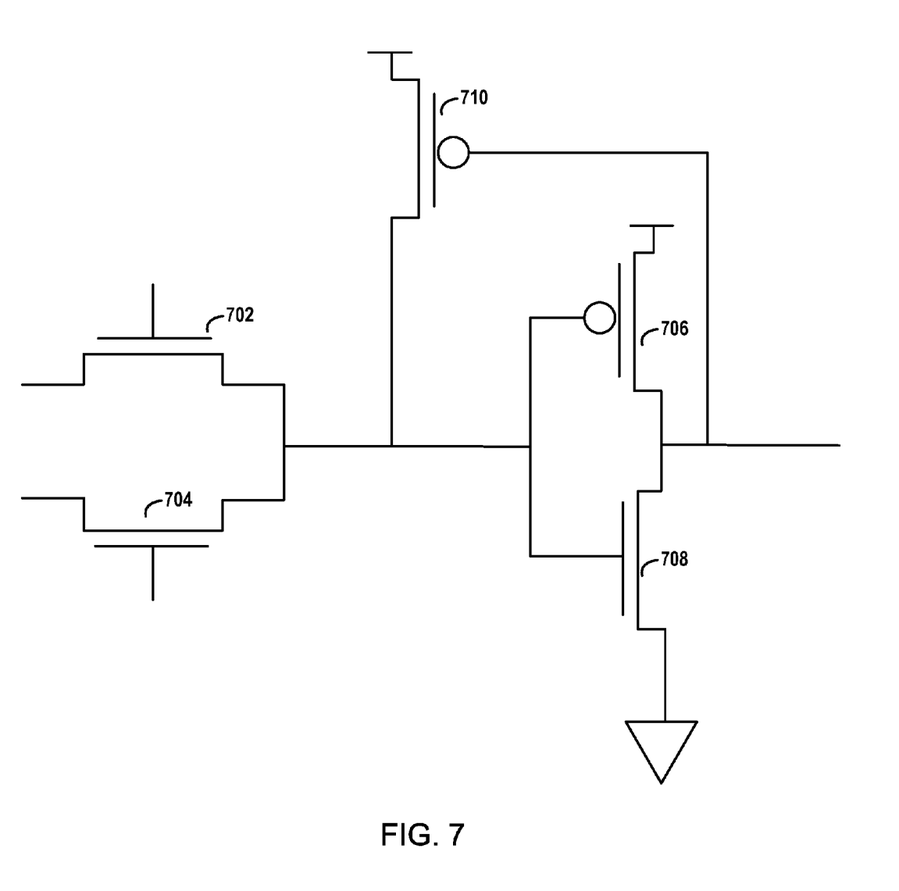
FIG. 7 depicts a circuit diagram for a multiplexer.

FIG. 7 depicts a circuit diagram for a multiplexer. The specific circuit diagram of FIG. 7 depicts a 2:1 multiplexer; however, larger multiplexers are possible and even preferred. The multiplexer of FIG. 7 can be used as part of the interconnection networks discussed herein. FETs 702 and 704 are input FETs that output one of two different inputs depending upon a control signal. FETs 706 and 708 operate as a buffer for the selected input. FET 710 provides a pull-up function to the signal connecting the input FETs 702/704 and buffer FETs 706 and 708. The basic functionality for this 2:1 multiplexer can be used to construct larger multiplexers (e.g., 4:1, 8:1 or larger), as desired by, for instance, adding additional FETs connected consistent with the connection of FET 702 and FET 704.

The specific circuit of FIG. 7 represents one possible implementation that can be used in connection with the interconnection networks discussed herein, and various other multiplexer circuits could be employed without limitation.

Certain embodiments relate to the realization that the multiplexer-based interconnection networks discussed can exhibit significantly different delay characteristics relative to corresponding non-multiplexer-based interconnection networks. For instance, the multiplexer-based interconnection networks can be designed with all (or most) multiplexers of a particular row being physically located near a corresponding logic block. Routing within a row can be accomplished using a single multiplexer. In this manner, signal routing within the row (sometimes referred to as a "tile") has low latency relative to multi-level switch networks. If a signal is routing between rows, each row will include an additional multiplexer delay. Moreover, routing between rows can include relatively long signal paths/wires, which can also introduce delays.

Accordingly, disclosed features relate to efficient and effective placement and/or routing solutions for programmable ICs. Certain embodiments are directed toward the assignment of numerical values to rows or tiles in a manner that allows for delay costs to be easily and efficiently determined. Various features are directed toward calculating a routing (latency, delay and/or power) cost as a function of the differences between the assigned numerical values of two tiles between which a signal is routed. Although the present disclosure sometimes refers to routing cost in terms of a specific one of latency, delay or power, the relevant discussions should not be read to be necessarily limited to any one of these specific parameters.

Figure 8:
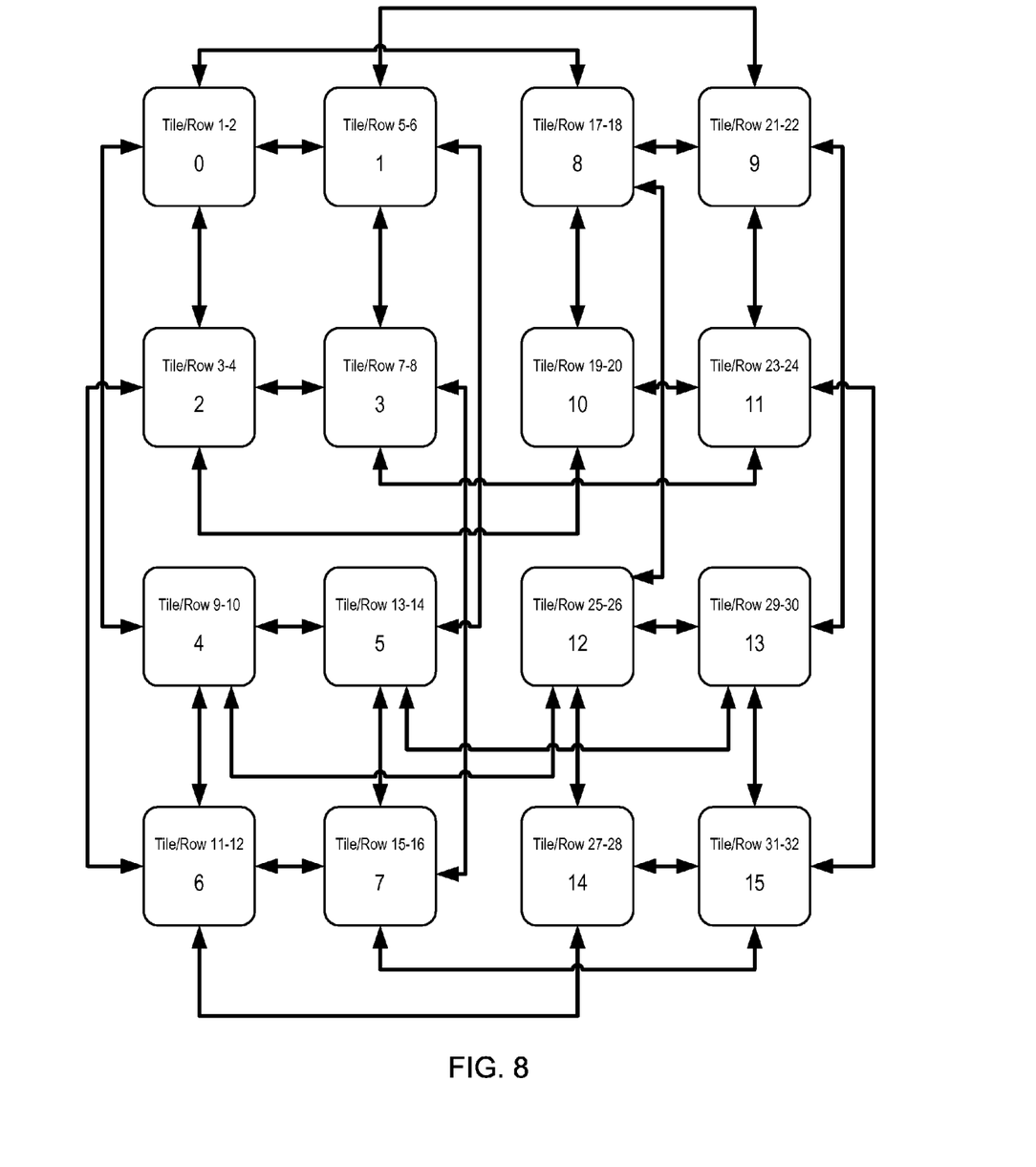
FIG. 8 depicts an interconnection network diagram of tiles and their direct connections.

FIG. 8 depicts an interconnection network diagram of tiles and their direct connections. Each block represents a tile of the interconnection network. The particular embodiment of FIG. 8 corresponds to a multiplexer interconnection network derived from a Benes network; however, other embodiments are also possible. The tile/row numbers, indicated for each tile, correspond to a row designation consistent with the diagram of FIG. 1, which has also been expanded to include 32 inputs. For instance, block 1-2 corresponds to a row that includes global inputs and outputs 1-2. A similar diagram can be constructed for networks of arbitrary size.

The large tile number below the block number represents an assigned value for the tile. This assigned value is derived from the surprising recognition that signal delays for the interconnection network can be represented based upon the bit differences (in a binary/base-2 numerical system) between these assigned values. In particular, the assigned value denotes that a signal can only be routed directly to, and only directly to, tiles that have assigned values that differ by only a single bit. Moreover, the minimum number of tiles necessary to route between two tiles is represented by the number of bits that are different between the two assigned values. Accordingly, delay for a signal can be reduced or minimized by placement and/or routing to minimize the bit differences between the assigned values.

Somewhat surprisingly, the delay factor does not necessarily correspond to physical proximity within the two dimensional grid of the diagram. This is true whether proximity is defined using a traditional Manhattan distance metric or some other proximity determination. Instead, the delay factor is easily determined from the number of bits that differ between the assigned values of two blocks or tiles. For instance, given a starting tile, all tiles directly connected thereto can be determined by modifying each bit of the assigned value for the starting tile. It can therefore be shown that routing a signal from block 0 to block 1 has the same cost as routing from block 0 to any of blocks having only one bit difference. This relationship can extend to an arbitrarily sized network. For example, in a network having 36 blocks (not shown), each of blocks 1, 2, 4, 8, 16 or 32 would have the same cost relative to block 0. Thus, looking at 6 bits and starting from $000000_2$, the one-bit changes are $000001_2$ ($1_{10}$), $000010_2$ ($2_{10}$), $000100_2$ ($4_{10}$), $001000_2$ ($8_{10}$), $010000_2$ ($16_{10}$) and $100000_2$ ($32_{10}$). The same analysis can be applied to other starting tiles.

Moreover, it can be shown that the minimum number of tiles necessary to traverse between any two tiles is represented by the bit differences. As an example, tile 4 is represented as $00100_2$ and tile 13 is represented as $00111_2$. The assigned values of these two tiles differ by two bits. Thus, routing a signal from tile 4 to tile 13 requires traversal of at least two tiles (tile 5 and tile 13). It is worth noting that inputs and outputs have been paired in the tiles and that a signal can be routed to and from the same tile without incurring a cost in terms of the bit differential.

The assigned values can be particularly useful for placement of logic functions within a programmable IC. The placement can be determined using a placer cost function derived from a comparison of the bit differentials for each differential.

The placer cost function can be implemented as a summation of all bit differentials, limited to delay-critical signals and/or weighted according to signal criticality. Accordingly, after calculating routing-network latency by determining number of bits that differ between each row, the calculated signal routing cost can be provided to the placement module.

A routing module, for routing the signals between placed logic, can also use the assigned values to determine the preferred routing paths. For a given tile, the total number of directly connected tiles can be determined by modifying each bit of the assigned value for the starting tile. This set of values represents those tiles to which a signal can be directly routed. This set of values can be further reduced by removing values that correspond to bits that are common between the starting tile and the destination tile. For instance, if the starting tile has a value of 0100, then the set of directly connected tiles includes 0101, 0110, 0000 and 1100. If the destination tile is 1110, then the set of directly connected tiles can be reduced to 0110 and 1100. This reduced set of tiles represents the possible connecting tiles for which the minimal routing depth (e.g., least number of traversed tiles) can be achieved. This type of analysis can be repeated for each tile in the reduced set (relative to the destination tile) to produce a second set of tiles and so forth until the destination tile is reached. The resulting set of signal paths represents the set of signal routing paths that traverse the least number of tiles.

A further consideration relates to the wire length between respective tiles. For example, two signal paths traverse the same number of total tiles, yet have different delay times due to the respective wire lengths. A relatively simple manner to determine likely wire lengths is premised upon the realization that differences in high-order bits imply larger physical distances between tiles than differences in lower-order bits. This relationship between bit order and wire length need not be perfect; however, the relationship can still provide a relatively simple and efficient benchmark for selecting between otherwise equivalent signal paths.

It is therefore possible to calculate the various placement and routing costs using an efficient bit comparison between tiles. These calculated costs are not limited to Benes network equivalent multiplexer interconnection networks and can be used in connection with a variety of different multiplexer interconnection networks. For instance, the costs can be used for non-binary fat tree networks.

Figure 9:
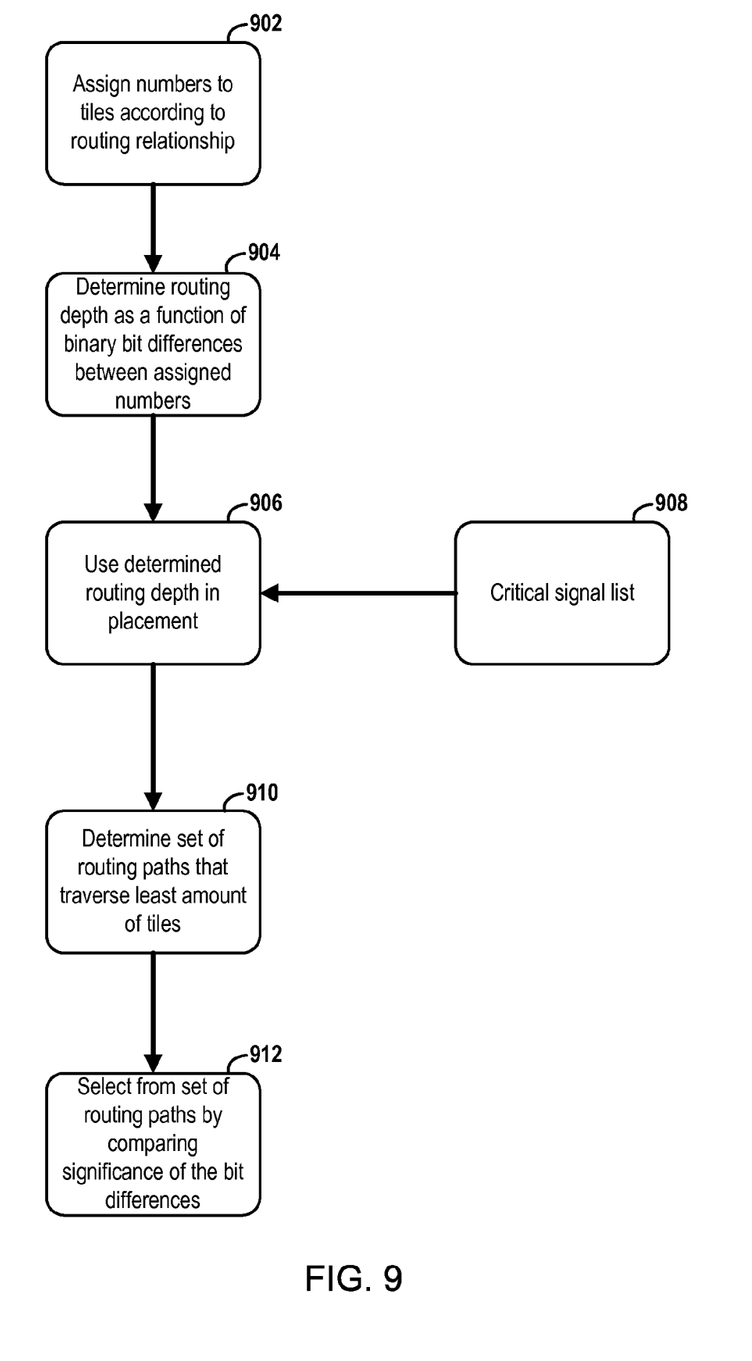
FIG. 9 depicts a flow diagram for placement and/or routing of a programmable integrated circuit in connection with a multiplexer-based interconnection network.

FIG. 9 depicts a flow diagram for placement and/or routing of a programmable integrated circuit in connection with a multiplexer-based interconnection network. At step 902, numbers are assigned to each tile of the routing network. In a specific implementation, the numbers are sequentially assigned according to rows associated with the tiles and derived from a non-blocking switched-based interconnection network from which the multiplexer interconnection network is derived. The underlying switched-based interconnection network can be, for example, a Benes network consistent with the structure depicted in of FIG. 1. The assigned numbers can, for example, correspond to the assignment shown in FIG. 8.

A functional/logic design for implementation in a programmable integrated circuit can specify a number of logic functions that are to be placed within various logic blocks. The design can also specify the interconnections between the logic functions. Step 904 involves determining a minimum routing depth for signal interconnections of a particular design. The routing depth represents the number of tiles that are traversed in the routing of a signal between two logic blocks. Proposed placements of the logic functions can be evaluated based upon the determined routing depth for the signal interconnections. The particular manner in which a minimum routing depth is determined can include a comparison between the assigned numbers. In particular, the number of bits that differ between the assigned numbers is representative of the (minimum) routing depth.

Using the determined routing depth, proposed placements can be scored and a desired placement can be selected, as depicted by step 906. Optionally, the placement score can consider the relative importance of different signals 908 as a function of their delays. For instance, certain functional blocks may have few or no time-critical signals and the routing depth for these signals can therefore be discounted or even not considered at all when determining a placement score.

For a determined placement, the routing solutions can then be determined. This can involve the identification of the set of shortest routing depths/paths (e.g., traversing the least amount of tiles) as depicted in step 910. This determination can be implemented in a variety of manners, one of which involves identifying paths based upon individual bit changes to the assigned value to reach the destination tile, as discussed in more detail herein.

Step 912 involves identifying a particular routing path from these routing paths with the shortest depths. Although not limited thereto, this selection can be made by comparing the relative significance of the bits that differ between the tiles.

The steps depicted in FIG. 9 are not meant to be limiting and represent one of a myriad of possible manners in which bit differentials between values assigned to tiles can be used. For instance, the placement and routing functions can be iteratively implemented to compare various proposed solutions. The delay estimation described herein can be applied to a variety of methods for constructing an integrated circuit or a configuration bitstream for a programmable integrated circuit. These methods include, but are not limited to methods for placement, including the cost function in simulated annealing, min-cut and min-cost partitioning; routing methods including maze routing and assignment-based routing; logic synthesis using placement or other physical estimation or routing cost; and power estimation.

The various steps can be automated using a specially designed processor system. For instance, instructions stored on a non-transitory storage medium can be accessed by a processor to implement the various steps. The processor can then store the output of the process, e.g., data representing the placement or routing information, on a non-transitory storage medium. This stored data can then be accessed and used to produce/configure a programmable integrated circuit that implements the desired functional/logic design.

The processes of the example embodiments may be implemented in a variety of computing arrangements. Those skilled in the art will appreciate that various alternative computing arrangements, including one or more processors and a memory arrangement configured with program code, would be suitable for hosting the processes and data structures of the different embodiments. In addition, program code that implements the processes may be provided via a variety of computer-readable storage media or delivery channels such as magnetic or optical disks or tapes, electronic storage devices, or as application services over a network.

The architecture of the computing arrangement depends on implementation requirements, as would be recognized by those skilled in the art. The computing arrangement may include one or more general purpose processors, or a combination of one or more general purpose processors and suitable co-processors, or one or more specialized processors (e.g., RISC, pipelined, etc.). The memory/storage arrangement of the computing arrangement may be hierarchical storage as is commonly found in computing arrangements. Such hierarchical storage typically includes multiple levels of cache memory, a main memory, and local and/or remote persistent storage such as provided by magnetic disks or electronic storage media. The memory/storage arrangement may include one or both of local and remote memory/storage, remote storage being coupled to the processor arrangement via a local area network, for example.

The disclosed embodiments are believed to be applicable to a variety of interconnection networks. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of determining signal routing costs in a non-blocking routing network that provides routing functionality using a single level of a plurality of multiplexers in each row of a plurality of rows of the routing network, the method comprising:
   using a programmed processor to perform operations including:
      assigning a respective numerical value, represented by bits, to each row of the routing network, the plurality of rows including eight or more rows and wherein a number of bits that differ between the respective numerical values of each pair of rows of the plurality of rows indicates a number of row traversals necessary to traverse from a first row of the pair to a second row of the pair;
      calculating a signal routing cost based upon the number of bits that differ between the respective numerical values of the first row and the second row of the routing network; and
      providing the calculated signal routing cost to a placement module.

2. The method of claim 1, wherein the respective numerical values represent a number of multiplexers necessary to traverse from the first row to the second row of the routing network.

3. The method of claim 1, wherein:
   the routing network comprises a multiplexer-based network that provides routing equivalence to a non-blocking crossbar network that has a plurality of crossbar switches making up an ingress stage, a middle stage, and an egress stage;
   the non-blocking crossbar network includes a plurality of crossbar rows, each crossbar row including outbound and inbound internal connections to another crossbar row;
   the multiplexer-based network includes a plurality of multiplexer-based network rows each including at least one external input and at least one external output, each multiplexer-based network row of the plurality of multiplexer-based network rows corresponding to a crossbar row of the non-blocking crossbar network and including a corresponding set of multiplexers; and
   each set of multiplexers includes:
      an internal multiplexer for each respective outbound internal connection of the respective crossbar row, the internal multiplexer including inputs for signals routable to the respective outbound internal connection; and
      at least one external multiplexer providing a signal to an external output of the multiplexer-based network row, the external multiplexer including a set of inputs that, in combination with the internal multiplexers, routes any external input of the multiplexer-based network row to the external output of the multiplexer-based network row.

4. The method of claim 1, wherein the calculating a signal routing cost includes determining at least one of power, delay, or latency for a signal traversing a particular signal path.

5. The method of claim 1, wherein the calculating a signal routing cost is determinative of a cost function for at least one of simulated annealing, min-cut partitioning, or min-cost partitioning.

6. The method of claim 1, wherein the calculating a signal routing cost includes a cost function for at least one of a maze routing or an assignment-based routing.

7. The method of claim 1, wherein the calculating a signal routing cost includes a cost function for at least one of placement, physical estimation, routing cost, or power estimation.

8. The method of claim 1, further including identifying a routing path between two rows by incrementally modifying single bits of an assigning numerical value for one of the two rows to arrive at an assigned numerical value for the other of the two rows, wherein each incremental modification of a bit represents a row in the routing path.

9. The method of claim 1, further including assigning weights to signals and wherein the signal routing cost is a function of the assigned weights.

10. A method of placing logic functions in a programmable integrated circuit that includes a multiplexer-based network that emulates a crossbar non-blocking routing network, the method comprising:
    using a programmed processor to perform operations including:
       calculating routing costs for the multiplexer-based network according to respective numerical values assigned to rows of a set of rows of a plurality of rows of the multiplexer-based network, the plurality of rows including eight or more rows;
       wherein a number of bits that differ between the respective numerical values of each pair of rows of the plurality of rows of the multiplexer-based network corresponds to a minimum number of row traversals necessary to route a signal between a first row and a second row of the pair;
    selecting a placement of logic blocks as a function of the calculated routing costs; and
    storing the selected placement in a non-transitory storage medium.

11. The method of claim 10, wherein:
    the multiplexer-based network provides routing equivalence to the crossbar non-blocking network;
    the crossbar non-blocking network includes a plurality of crossbar switches making up an ingress stage, a middle stage, and an egress stage;
    the crossbar non-blocking network includes a plurality of crossbar rows, each crossbar row including outbound and inbound internal connections to another crossbar row;
    the multiplexer-based network includes a plurality of multiplexer-based network rows each including at least one external input and at least one external output, each of the multiplexer-based network rows corresponding to a crossbar row of the crossbar network and including a corresponding set of multiplexers; and
    each set of multiplexers includes:
       an internal multiplexer for each respective outbound internal connection of the respective crossbar row, the internal multiplexer including inputs for signals routable to the respective outbound internal connection; and at least one external multiplexer providing a signal to an external output of the multiplexer-based network row, the external multiplexer including a set of inputs that, in combination with the internal multiplexers, routes any external input of the multiplexer-based network row to the external output of the multiplexer-based network row.

12. The method of claim 10, further including storing signal values at the output of the multiplexers within the multiplexer-based network.

13. The method of claim 10, further including identifying a set of rows directly connected to a particular row by finding a set of numerical values that differ from the numerical value assigned to the particular row by only a single bit.

14. The method of claim 10, wherein the calculated routing costs include one or more of latency, delay, or power.

15. A non-transitory computer-readable storage medium that includes a set of stored instructions that when executed by a computer processor perform a method of determining signal routing costs in a non-blocking routing network that provides routing functionality using a single level of a plurality of multiplexers in each row of a plurality of rows of the routing network, the method comprising:

assigning a respective numerical value, represented by bits, to each row of the routing network, the plurality of rows including eight or more rows and wherein a number of bits that differ between the respective numerical values of each pair of rows of the plurality of rows indicates a number of row traversals necessary to traverse from a first row of the pair to a second row of the pair;

calculating a signal routing cost based upon the number of bits that differ between the respective numerical values of the first row and the second row of the routing network; and providing the calculated signal routing cost to a placement module.

16. The storage medium of claim 15, wherein the method further comprises:

calculating signal routing costs for a plurality of signal routing paths associated with a proposed placement of logic blocks within a programmable integrated circuit.

17. The storage medium of claim 15, wherein the calculating a signal routing cost includes assessing a physical distance between rows based upon an order of bits that differ between each row.

18. The storage medium of claim 15, wherein the calculating a signal routing cost includes excluding a subset of the signal routing cost in response to an indication that corresponding signals are not critical.

19. The storage medium of claim 15, wherein, for a particular signal path between two rows of the routing network, the calculated signal routing cost represents a minimum number of rows traversed to route a signal therebetween.

* * * * *